United States Patent
Schmitt et al.

(10) Patent No.: US 7,649,798 B2
(45) Date of Patent: Jan. 19, 2010

(54) MEMORY DEVICE USING ANTIFUSES

(75) Inventors: Jonathan Alois Schmitt, Eden Prairie, MN (US); Laurentiu Vasiliu, San Diego, CA (US); Myron Buer, Gilbert, AZ (US)

(73) Assignee: Broadcom Corporation, Irvine, CA (US)

( * ) Notice: Subject to any disclaimer, the term of this patent is extended or adjusted under 35 U.S.C. 154(b) by 206 days.

(21) Appl. No.: 11/505,744

(22) Filed: Aug. 17, 2006

(65) Prior Publication Data

US 2008/0043509 A1 Feb. 21, 2008

(51) Int. Cl.
*G11C 7/00* (2006.01)

(52) U.S. Cl. .................................. 365/225.7; 365/96

(58) Field of Classification Search .............. 365/225.7, 365/96
See application file for complete search history.

(56) References Cited

U.S. PATENT DOCUMENTS

| | | | | | |
|---|---|---|---|---|---|
| 5,622,886 | A | * | 4/1997 | Allum et al. | 438/238 |
| 5,767,734 | A | * | 6/1998 | Vest et al. | 327/536 |
| 5,793,246 | A | * | 8/1998 | Vest et al. | 327/536 |
| 5,880,502 | A | * | 3/1999 | Lee et al. | 257/372 |
| 5,886,392 | A | * | 3/1999 | Schuegraf | 257/530 |
| 5,976,960 | A | * | 11/1999 | Cheffings | 438/525 |
| 6,044,012 | A | * | 3/2000 | Rao et al. | 365/182 |
| 6,096,589 | A | * | 8/2000 | Lee et al. | 438/225 |
| 6,320,235 | B1 | * | 11/2001 | Cheffings | 257/382 |
| 6,865,382 | B2 | * | 3/2005 | Behzad | 455/323 |
| 6,903,993 | B2 | | 6/2005 | Smith et al. | |
| 7,250,665 | B1 | * | 7/2007 | Toros et al. | 257/463 |
| 7,279,406 | B2 | * | 10/2007 | Koontz | 438/589 |
| 2003/0176033 | A1 | * | 9/2003 | Grider et al. | 438/231 |
| 2005/0101280 | A1 | * | 5/2005 | Behzad | 455/293 |
| 2006/0097345 | A1 | * | 5/2006 | Marr | 257/530 |
| 2006/0146158 | A1 | * | 7/2006 | Toros et al. | 348/308 |
| 2006/0291267 | A1 | * | 12/2006 | Jenne et al. | 365/102 |
| 2006/0291316 | A1 | * | 12/2006 | Jenne | 365/225.7 |
| 2007/0008800 | A1 | * | 1/2007 | Jenne | 365/225.7 |
| 2008/0186753 | A1 | * | 8/2008 | Buer et al. | 365/96 |
| 2009/0003113 | A1 | * | 1/2009 | Terzioglu et al. | 365/226 |
| 2009/0109724 | A1 | * | 4/2009 | Buer et al. | 365/96 |

* cited by examiner

*Primary Examiner*—Michael T Tran
(74) *Attorney, Agent, or Firm*—McAndrews, Held & Malloy, Ltd.

(57) ABSTRACT

Herein described is a method of implementing one or more native NMOS antifuses in an integrated circuit. Also described is a method for programming one or more native NMOS antifuses used within a memory device. The method further comprises verifying one or more states of the one or more native NMOS antifuses after the programming has been performed. In a representative embodiment, the one or more native NMOS antifuses are implemented by blocking the implantation of a dopant into a substrate of an integrated circuit. In a representative embodiment, an integrated circuit incorporates the use of one or more native NMOS antifuses. In a representative embodiment, the integrated circuit comprises a memory device, such as a one time programmable memory.

36 Claims, 3 Drawing Sheets

MEMORY DEVICE USING ANTIFUSES

BACKGROUND OF THE INVENTION

Improvements in integrated circuit technology have produced smaller devices with higher performance and reduced power consumption. These improvements may be employed in the fabrication of integrated circuits such as integrated circuit memories. One such memory comprises a one time programmable memories (OTPs). When designing or fabricating a one time programmable memory (OTP), the supply voltages that are used to power the OTP may be large because of internal design requirements. Such internal design requirements may be related to the voltage level requirements of the individual components that are used to implement the OTP. These voltage levels may be related to proper biasing of the electronic components in the OTP. When an OTP is implemented using NMOS (n channel MOSFET) logic, proper forward biasing of an n channel MOSFET may result in a voltage drop, $V_T$, across the gate to the drain of such a transistor, for example. Unfortunately, such voltage drops may relate to increases in power consumption when operating a one time programmable memory (OTP).

The limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Aspects of the invention provide at least a method of implementing an antifuse in an integrated circuit. Aspects of the invention provide at least an integrated circuit that incorporates the use of one or more native NMOS antifuses. The various aspects of the invention are substantially shown in and/or described in connection with at least one of the following figures, as set forth more completely in the claims.

These and other advantages, aspects, and novel features of the present invention, as well as details of illustrated embodiments, thereof, will be more fully understood from the following description and drawings.

DETAILED DESCRIPTION OF THE INVENTION

Various aspects of the invention provide for a method of fabricating a native NMOS antifuse. Furthermore, the various aspects of the invention provide for at least an integrated circuit that is implemented using one or more native NMOS antifuses. In a representative embodiment, the integrated circuit comprises a memory device. In accordance with the various aspects of the invention, the native NMOS antifuse may be fabricated by way of blocking a threshold implant that is typically used during a NMOS fabrication process. By blocking the threshold implant, occurrence of a threshold voltage between a gate and a drain of an antifuse may be minimized or reliably eliminated when the antifuse is programmed. In a NMOS process, for example, a parasitic transistor diode may be created between a gate and a drain of an antifuse when the antifuse is programmed, for example. The parasitic transistor diode creates a typical diode characteristic having a threshold voltage, $V_T$. Unfortunately, an existence of such a threshold voltage may inhibit or interfere with a subsequent verification test that may be used to properly read the state of the antifuse. Furthermore, the existence of the threshold voltage also makes it difficult to further program the antifuse.

By using a native NMOS process, a memory device may be implemented using one or more antifuses. In a representative embodiment, the memory device comprises a one time programmable memory (OTP). The OTP may be fabricated as a high speed digital integrated circuit, for example.

Figure 1:
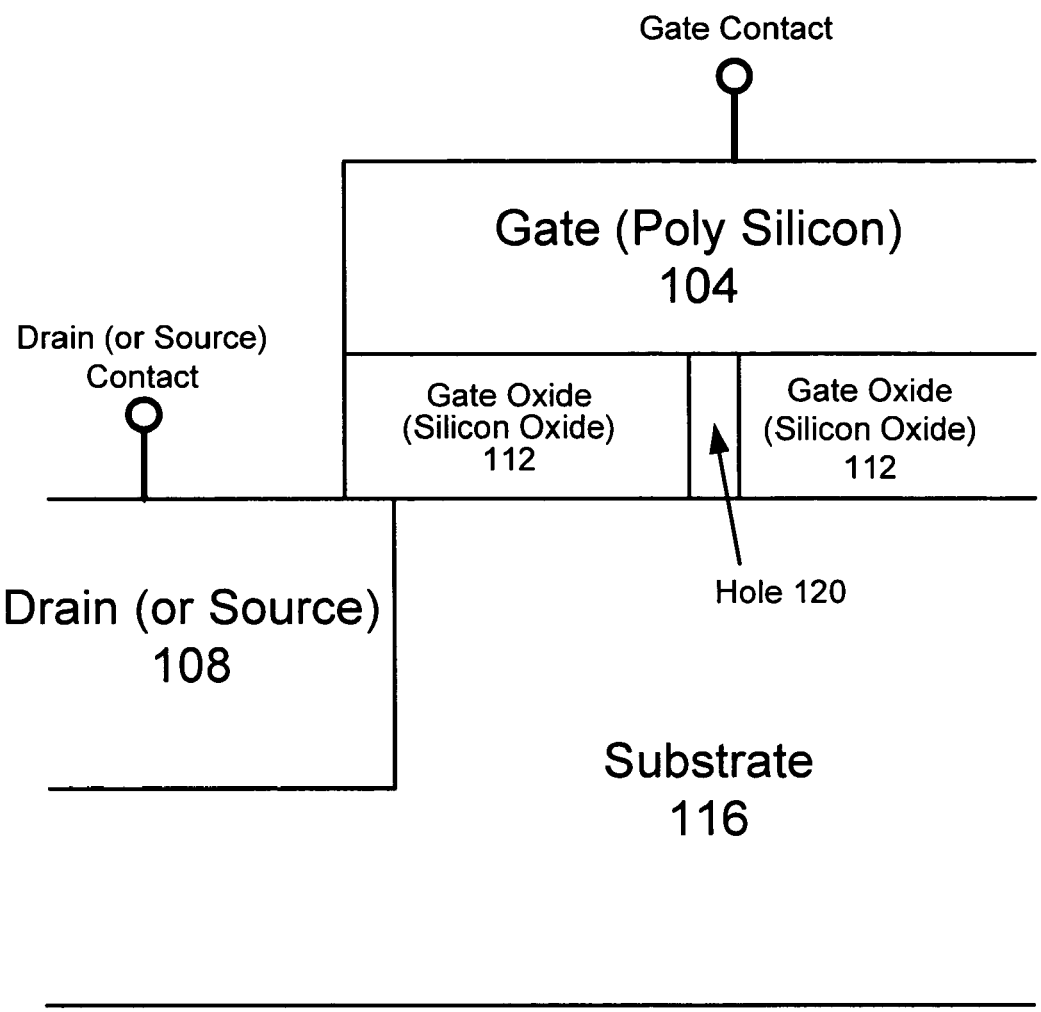
FIG. 1 is a block diagram of a crossectional view of a native NMOS antifuse as fabricated in an integrated circuit in accordance with an embodiment of the invention.

FIG. 1 is a block diagram of a crossectional view of a native NMOS antifuse as fabricated in an integrated circuit in accordance with an embodiment of the invention. The native NMOS antifuse comprises a poly silicon gate 104, a drain (or source) 108, a gate oxide (silicon oxide) layer 112, a hole 120 within the gate oxide layer 112, and a substrate 116. In a representative embodiment, the native NMOS antifuse may be fabricated using either a drain or source 108 of an NMOS transistor. In contrast to a non-native NMOS antifuse, the substrate 116 of the native NMOS antifuse is not doped or implanted with any dopant. For example, implantation of a dopant, such as boron or phosphorus, into the substrate 116 of an NMOS antifuse is not allowed in a native NMOS process. The hole 120 comprises a semiconductor material that provides a path in which current may travel from the gate 104 to the drain 108. However, the current flows only when the voltage at the gate is higher than a threshold voltage, $V_T$, for a non-native NMOS antifuse. When an antifuse is fabricated using a native NMOS process, the voltage threshold is eliminated, such that the path between the hole 120 and the drain 108 is purely resistive. The native NMOS antifuse delineated in FIG. 1 may represent one cell in an integrated circuit. This cell may be used any number of times in the design and creation of an integrated circuit memory. The representative embodiment of FIG. 1 also depicts a gate contact connected to the gate and a drain (or source) contact connected to the drain (or source) of the native NMOS antifuse. The integrated circuit memory may comprise a one time programmable memory (OTP), for example.

Figure 2:
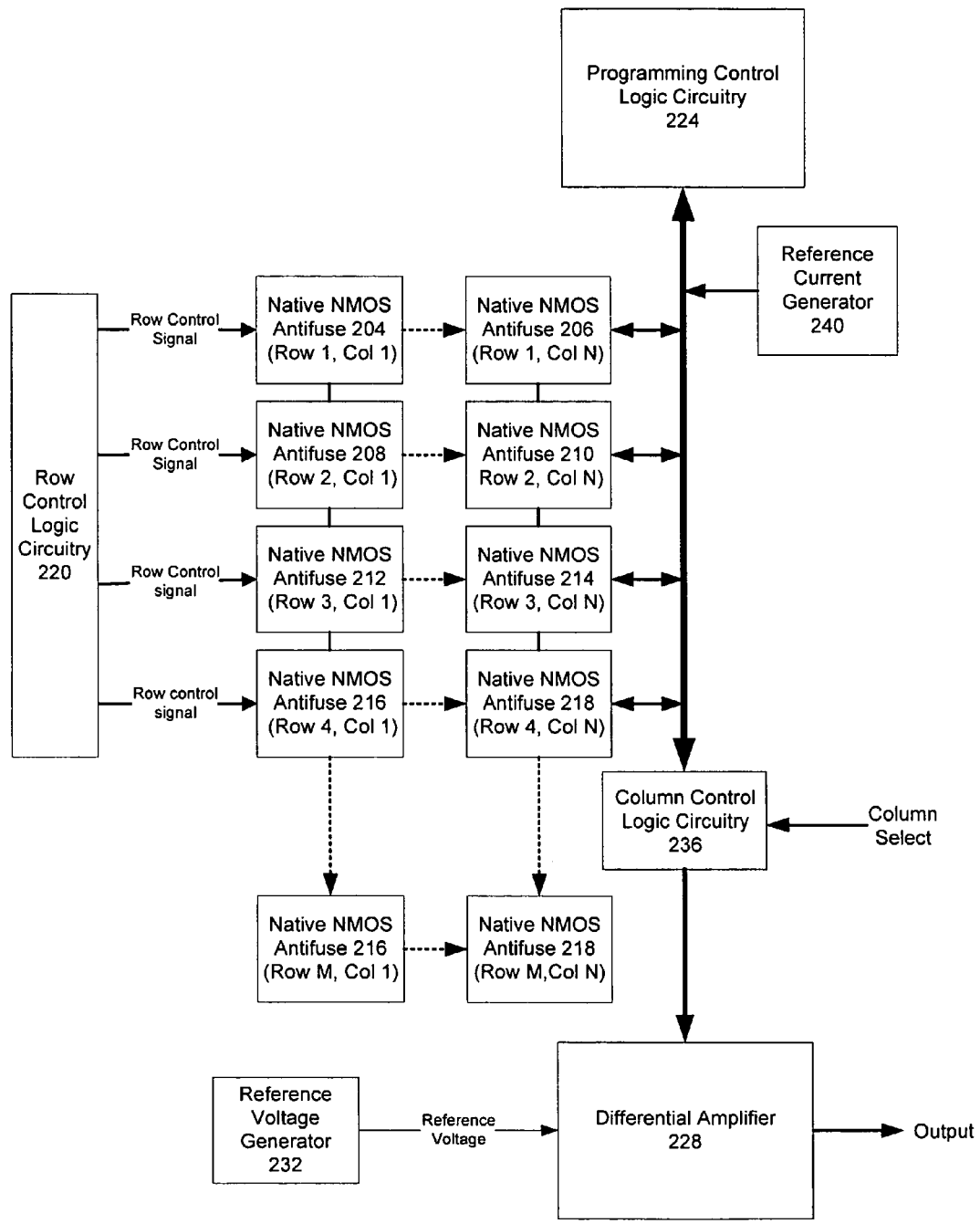
FIG. 2 is a block diagram of a memory device illustrating a number of native NMOS antifuses along with supporting circuitry in accordance with an embodiment of the invention.

FIG. 2 is a block diagram of a memory device illustrating a number of native NMOS antifuses along with supporting circuitry in accordance with an embodiment of the invention. In a preferred representative embodiment, one or more native NMOS antifuses are used to implement an integrated circuit memory, such as a one time programmable memory (OTP). Absence of a threshold voltage in the one or more native NMOS antifuses facilitates the use of lower supply voltages in powering the OTP. In a representative embodiment, the absence of a threshold voltage in each of the one or more native NMOS antifuses facilitates the use of a lower supply voltage when powering an associated differential sense amplifier. In this representative embodiment, one or more gates of the native NMOS antifuses are connected to the inputs of the differential sense amplifier. In a representative embodiment, the memory device (or OTP) comprises a number of native NMOS antifuses arranged in rows and columns. In a representative embodiment, the native NMOS antifuses may be arranged as a M×N (i.e., M rows by N columns) array.

For the sake of simplicity, only two columns and four rows of native NMOS antifuses 204, 206, 208, 210, 212, 214, 216, 218 (i.e, a total of eight) are shown in the memory device (or OTP) of FIG. 2. The memory device comprises a row control logic circuitry 220, a programming control logic circuitry 224, a column control logic circuitry 236, a reference voltage generator 232, a reference current generator 240, and a differential amplifier 228. The column control logic circuitry 236 may comprise a N:1 column multiplexer, where N corresponds to the number of columns of native NMOS antifuse devices in the memory device, for example. The column control logic circuitry 236 may utilize a column select signal as an input for selecting one of N columns in the M×N array. The row control logic circuitry 220 may be used to enable a particular row of the M rows represented in the array. The row control logic circuitry 220 may transmit row control signals to each of the native NMOS antifuses in the array. The programming control logic circuitry 224 may comprise a voltage source that may be used for breaking down the gate oxide of each of the native NMOS antifuses in the array. The voltage source may be configured to be at a level high enough in magnitude to break down the gate oxide reliably. In a representative embodiment, the voltage source comprises a 5 Volt source. The programming control logic circuitry 224 may comprise timing and logic circuitry used in programming one or more the native NMOS antifuses in the array. When one of the one or more native NMOS antifuses are selected and programmed by the programming control logic 224, the gate oxide of the selected antifuse is ruptured or broken down and the gate to drain is electrically connected by way of a low resistance. As a consequence, the gate is essentially shorted to ground (via the drain or source) through the low resistance; and as a consequence, the voltage at the gate is interpreted to be a logical '0' state. If a particular antifuse is not programmed, the gate oxide is left intact, and the gate to drain (or source) is open circuited. The reference current generator 240 may be used, for example, to verify the state of a particular antifuse after programming has occurred. The reference current generator 240 may be used to verify whether a particular antifuse was programmed or not. The reference current generator 240 sources current to a selected antifuse. If the antifuse's gate is ruptured or broken, the current passes through the gate to ground; as a consequence, the voltage reading at the gate is a low voltage or interpreted as a logical '0'. If on the other hand, the antifuse's gate is not ruptured, the current cannot pass through the gate, and the voltage reading at the gate is a high voltage or interpreted as a logical '1'. The gate voltage from a particular antifuse may be transmitted to the differential amplifier 228, where it is amplified. The differential amplifier 228 may comprise a differential sense amplifier. The differential amplifier 228 may invert the received gate voltage before it is output. The reference voltage generator 232 provides a reference voltage to power the differential amplifier 228. The row control logic circuitry 220, the column control logic circuitry 236, and the programming control logic circuitry 224 may comprise any type of digital hardware or electronics.

Figure 3:
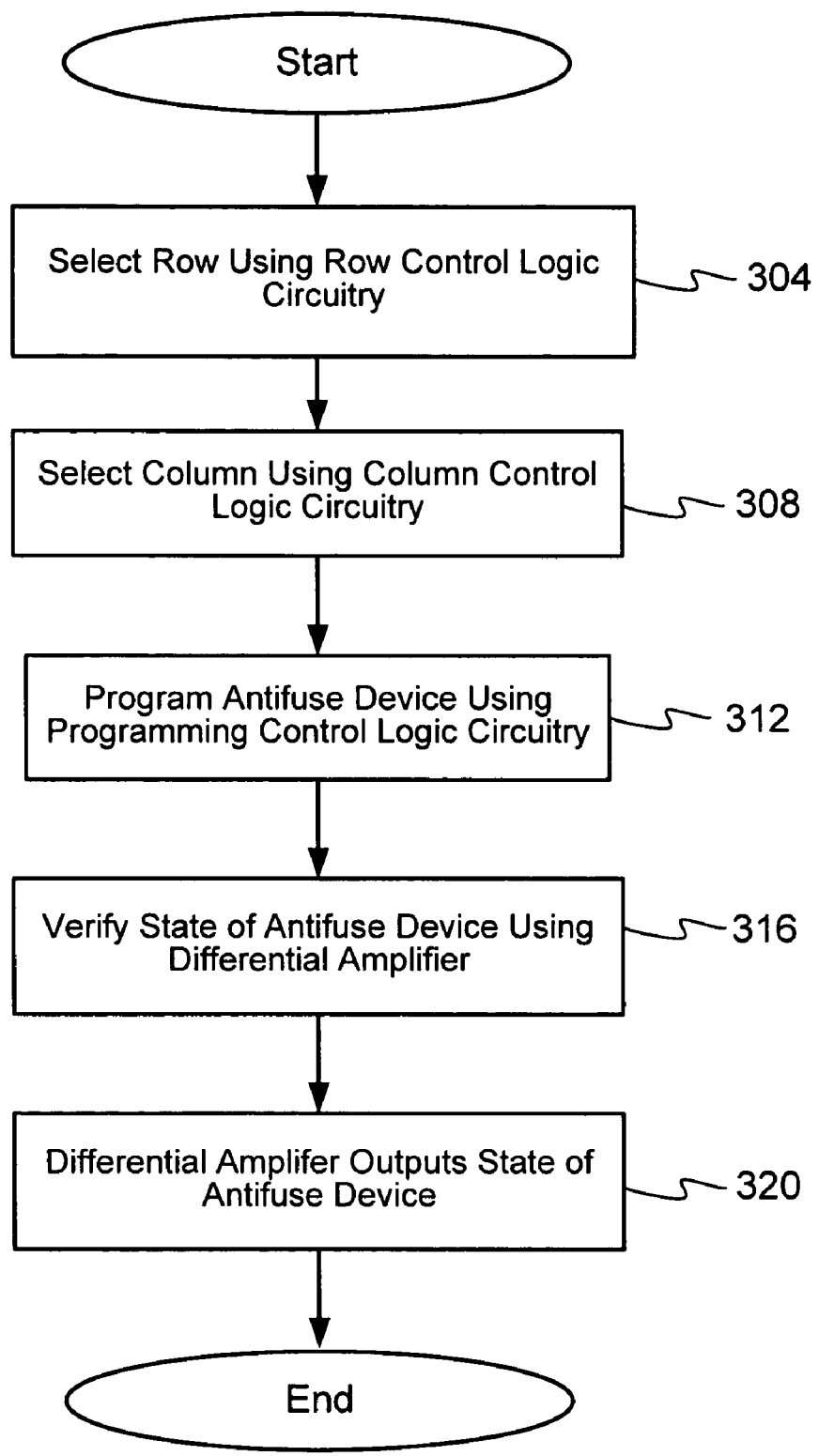
FIG. 3 is an operational flow diagram describing the programming of a native NMOS antifuse and subsequent verification of a state of a native NMOS antifuse for the memory device illustrated in FIG. 2, in accordance with an embodiment of the invention.

FIG. 3 is an operational flow diagram describing the programming of a native NMOS antifuse and subsequent verification of a state of a native NMOS antifuse for the memory device illustrated in FIG. 2, in accordance with an embodiment of the invention. At step 304, a particular row is selected in an array of native NMOS antifuses. A row control logic circuitry such as that previously described in reference to FIG. 2 may transmit one or more row control signals to enable the selection of a particular row. For an M×N array, one of M rows may be selected using the row control logic circuitry. At step 308, a particular column may be selected in the array of native NMOS antifuses. A column control logic circuitry such as that previously described in reference to FIG. 2 may be used to select one of N columns in the array. One of N columns in the array may be selected by the column control logic circuitry. After selecting a particular native NMOS antifuse using the row control logic circuitry and column control logic circuitry, the antifuse may be programmed using a programming logic control circuitry, at step 312. The programming control logic circuitry may utilize a supply voltage capable of rupturing or breaking down the gate oxide of the selected native NMOS antifuse. After the gate oxide has been ruptured, the corresponding antifuse is considered to have been programmed. When the gate oxide is ruptured, the gate of the antifuse is considered shorted to ground by way of a small resistance. Next at step 316, the state of the selected antifuse may be verified after programming has been performed. The state of the antifuse may be verified by sourcing a current into the gate of the selected antifuse. A reference current generator, such as that described in reference to FIG. 2, may be used to source the current. The voltage at the gate may be transmitted to the inputs of a differential amplifier, as previously described in FIG. 2. The differential amplifier may comprise an inverted differential sense amplifier, for example. At step 320, the differential amplifier may output the state of the selected native NMOS antifuse. If the selected native NMOS antifuse was properly programmed, then the output of an inverted differential sense amplifier would be a logical '1', for example. However, if the selected native NMOS antifuse was not programmed, then the output of an inverted differential sense amplifier would be a logical '0', for example.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A memory device comprising one or more antifuses used for programming said memory device wherein said one or more antifuses are implemented using a native NMOS process.

2. The memory device of claim 1 wherein said using a native NMOS process minimizes occurrence of a threshold voltage between a gate and a drain or source of said one or more antifuses.

3. The memory device of claim 1 wherein said using a native NMOS process eliminates the presence of a threshold voltage between a gate and a drain or source of said one or more antifuses.

4. The memory device of claim 1 wherein said one or more antifuses are used to implement a one time programmable memory (OTP).

5. The memory device of claim 1 further comprising a control logic circuitry for selecting a certain antifuse of a plurality of antifuses, said plurality of antifuses arranged in a M by N array, said control logic circuitry comprising:
 a column control logic circuitry for selecting one of N columns in said M by N array; and
 a row control logic circuitry for selecting one of M rows in said M by N array.

6. The memory device of claim 5 wherein said column control logic circuitry comprises a multiplexer used to select said one of N columns.

7. The memory device of claim 5 further comprising a current source used for driving said certain antifuse when verifying a state of said certain antifuse.

8. The memory device of claim 7 wherein a voltage reading is generated from said driving said certain antifuse, said voltage reading transmitted to a differential amplifier.

9. The memory device of claim 1 further comprising a voltage source for said programming said memory device.

10. The memory device of claim 9 wherein said voltage source is used for rupturing a gate oxide of a certain antifuse of said one or more antifuses.

11. The memory device of claim 10 wherein said rupturing said gate oxide produces a low resistance connection between a gate and a drain of said certain antifuse.

12. The memory device of claim 10 wherein said rupturing said gate oxide produces a low resistance connection between a gate and a source of said certain antifuse.

13. A method of using a memory comprising one or more antifuses, said method comprising:
   programming said one or more antifuses, said one or more antifuses fabricated using a native NMOS process.

14. The method of claim 13 where in said programming comprises applying a first voltage level to a gate of each of said one or more antifuses such that a low resistance is generated between said gate and its corresponding drain.

15. The method of claim 13 wherein said programming comprises applying a first voltage level to a gate of each of said one or more antifuses such that a low resistance is generated between said gate and its corresponding source.

16. The method of claim 14 further comprising:
   driving a current into said gate; and
   reading a second voltage level at said gate to verify said programming.

17. The method of claim 16 wherein said second voltage level corresponds to either a logical high level or a logical low level.

18. An integrated circuit memory comprising one or more antifuses, said one or more antifuses fabricated using a process that blocks a threshold implant.

19. The integrated circuit memory of claim 18 wherein said threshold implant is typically used for creating a threshold voltage between a gate and a drain of each of said one or more antifuses.

20. The integrated circuit memory of claim 19 wherein employing said one or more antifuses implements a one time programmable memory (OTP).

21. A memory device comprising one or more antifuses, said one or more antifuses used for programming said memory device, said one or more antifuses fabricated using a process that blocks a threshold implant, said threshold implant used for creating a threshold voltage between a gate and a source of a MOS transistor.

22. The memory device of claim 21 wherein said process that blocks said threshold implant eliminates occurrence of a threshold voltage for each of said one or more antifuses.

23. The memory device of claim 21 further comprising logic control circuitry used for selecting said one or more antifuses for said programming.

24. The memory device of claim 21 wherein said memory device comprises a one time programmable memory (OTP).

25. A method of eliminating a threshold voltage when an antifuse element within an integrated circuit is programmed, said method comprising:
   blocking a threshold implant when fabricating said antifuse element, said threshold voltage measured between a gate and a drain of said antifuse element.

26. The method of claim 25 wherein said blocking eliminates or reduces the occurrence of a threshold voltage when said antifuse element is programmed.

27. The method of claim 26 wherein said threshold voltage is read from a gate and a drain of said antifuse element.

28. The method of claim 26 wherein said threshold voltage is read from a gate and a source of said antifuse element.

29. The method of claim 25 wherein said blocking eliminates occurrence of a parasitic transistor diode characteristic between said gate and said drain.

30. An integrated circuit comprising:
   at least one antifuse fabricated using a process that blocks a threshold implant.

31. The integrated circuit of claim 30 wherein said threshold implant is located between a gate and a drain of each of said at least one antifuse.

32. The integrated circuit of claim 30 wherein said threshold implant is located between a gate and a source of each of said at least one antifuse.

33. The integrated circuit of claim 30 wherein said threshold implant is located within a substrate layer of said integrated circuit.

34. An integrated circuit comprising:
   at least one antifuse fabricated using a process that restricts the implantation of a dopant in a substrate layer.

35. The integrated circuit of claim 34 wherein said substrate is located below a gate oxide layer.

36. The integrated circuit of claim 34 wherein said dopant comprises boron or phosphorus.

* * * * *

UNITED STATES PATENT AND TRADEMARK OFFICE
CERTIFICATE OF CORRECTION

PATENT NO.        : 7,649,798 B2                                  Page 1 of 1
APPLICATION NO.  : 11/505744
DATED             : January 19, 2010
INVENTOR(S)       : Schmitt et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 361 days.

Signed and Sealed this

Twenty-third Day of November, 2010

David J. Kappos
*Director of the United States Patent and Trademark Office*